(12) United States Patent
Bhandari et al.

(10) Patent No.: US 9,444,068 B2
(45) Date of Patent: Sep. 13, 2016

(54) TRANSPARENT CONDUCTIVE OXIDE COATINGS FOR ORGANIC LIGHT EMITTING DIODES AND SOLAR DEVICES

(71) Applicant: PPG Industries Ohio, Inc., Cleveland, OH (US)

(72) Inventors: Abhinav Bhandari, Cranberry Township, PA (US); James W. McCamy, Export, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 0 days.

(21) Appl. No.: 14/200,832

(22) Filed: Mar. 7, 2014

(65) Prior Publication Data
US 2014/0312327 A1  Oct. 23, 2014

Related U.S. Application Data

(60) Provisional application No. 61/777,251, filed on Mar. 12, 2013.

(51) Int. Cl.
| | |
|---|---|
| *H01L 51/52* | (2006.01) |
| *H01L 51/00* | (2006.01) |
| *H01L 51/44* | (2006.01) |
| *H01L 51/56* | (2006.01) |

(52) U.S. Cl.
CPC ....... *H01L 51/5234* (2013.01); *H01L 51/0001* (2013.01); *H01L 51/442* (2013.01); *H01L 51/5203* (2013.01); *H01L 51/5215* (2013.01); *H01L 51/56* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 2003/0098647 A1* | 5/2003 | Silvernail | H01L 51/5237 313/506 |
| 2009/0135874 A1* | 5/2009 | Liu | 372/45.01 |
| 2009/0206741 A1* | 8/2009 | Yoon et al. | 313/504 |
| 2011/0006701 A1* | 1/2011 | Yu et al. | 315/291 |
| 2011/0080629 A1* | 4/2011 | Neuman | G02F 1/155 359/265 |
| 2012/0049044 A1* | 3/2012 | Kuboi | 250/208.1 |
| 2012/0168755 A1* | 7/2012 | Choi | 257/59 |
| 2012/0286651 A1 | 11/2012 | Levermore et al. | |
| 2012/0306940 A1* | 12/2012 | Machida et al. | 345/690 |
| 2013/0005139 A1 | 1/2013 | Krasnov et al. | |
| 2013/0113757 A1* | 5/2013 | Tanaka et al. | 345/174 |
| 2013/0248846 A1 | 9/2013 | Bilaine et al. | |

FOREIGN PATENT DOCUMENTS

WO  2012080684 A1  6/2012

OTHER PUBLICATIONS

PCT Search Report, PCT/US2014/022901, dated Aug. 25, 2014.

\* cited by examiner

*Primary Examiner* — Khaja Ahmad
(74) *Attorney, Agent, or Firm* — Andrew C. Siminerio

(57) ABSTRACT

A transparent conductive oxide (TCO) electrode for an organic light emitting diode (OLED) has a first layer of a crystalline material and a second layer of an amorphous material. The material of the second layer can include one or more dopant materials.

14 Claims, 5 Drawing Sheets

TRANSPARENT CONDUCTIVE OXIDE COATINGS FOR ORGANIC LIGHT EMITTING DIODES AND SOLAR DEVICES

CROSS REFERENCE TO RELATED APPLICATION

This application claims priority to U.S. Provisional Application No. 61/777,251, filed Mar. 12, 2013, herein incorporated by reference in its entirety.

BACKGROUND OF THE INVENTION

1. Field of the Invention

This invention relates generally to organic light emitting diodes, solar or photovoltaic (PV) cells and, more particularly, to electrode structures for such solar devices that provide improved manufacturing and operating performance.

2. Technical Considerations

An organic light emitting diode (OLED) is a light-emitting device having an emissive electroluminescent layer incorporating organic compounds. The organic compounds emit light in response to an electric current. Typically, an emissive layer of organic semiconductor material is situated between two electrodes (an anode and a cathode). In many conventional OLEDs, the cathode is typically an opaque metal layer and the anode is formed by a transparent conductive oxide (TCO) layer. The anode is transparent to allow light to exit the OLED. When electric current is passed between the anode and the cathode, the organic material emits light. OLEDs are used in numerous applications, such as television screens, computer monitors, mobile phones, PDAs, watches, lighting, and various other electronic devices.

Photovoltaic solar cells are in principle counterparts to light emitting diodes. Here, a semiconductor device absorbs the energy of light (photons) and converts that energy into electricity. Similar to OLEDs, the solar cell typically incorporates a TCO electrode.

In both OLEDs and solar cells, the TCO electrode should have certain characteristics. For example, the TCO electrode should have a high visible light transmission. Also, the TCO electrode should have a low sheet resistance (high conductivity). TCO conductivity is typically achieved by using an oxide coating doped with an electrically conductive material. The higher the dopant level, the lower the sheet resistance. However, increasing the dopant level can reduce the visible light transmission.

The TCO is typically a crystalline material because crystalline materials tend to be more conductive than amorphous materials and also require a lower "turn on" voltage than amorphous materials. However, a problem with crystalline materials is that their surface roughness is higher than that of amorphous materials due to their crystalline structure. If this surface roughness is too high, the crystals of a crystalline TCO anode can extend through the other layers of the OLED device and may contact the cathode, causing an electrical short.

Therefore, it would be advantageous to provide an electrode structure for use with OLEDs or solar cells that helps reduce the possibility of electrical shorts and/or reduces the turn on voltage for the device and/or maintains a desired level of electrical conductivity.

SUMMARY OF THE INVENTION

A light emitting device comprises a substrate, an emissive layer, a first electrode, and a second electrode. At least one of the first and second electrodes comprises a compound TCO electrode comprising a first layer comprising a crystalline material and a second layer comprising an amorphous material.

Another light emitting device comprises a substrate, an emissive layer, a first electrode, and a second electrode. At least one of the first and second electrodes comprises a compound TCO electrode comprising a first layer comprising an oxide material, an optional second layer comprising a metal material, and a third layer comprising an oxide material.

The oxide materials of the first and third layers can be independently selected from one or more oxides of Zn, Fe, Mn, Al, Ce, Sn, Sb, Hf, Zr, Ni, Zn, Bi, Ti, Co, Cr, Si, In or an alloy of two or more of these materials, such as zinc stannate. The first and/or third layer can be doped or non-doped.

In one aspect of the invention, the second layer is not present, the first layer comprises a doped oxide material, and the third layer comprises vanadium doped indium oxide.

In another aspect of the invention, the first layer comprises zinc doped indium oxide, the second layer is present, and the third layer comprises zinc doped indium oxide.

In a further aspect of the invention, the first layer comprises a doped oxide, the second layer is present, the third layer comprises titanium, and the compound TCO electrode further comprises a fourth layer over the third layer, with the fourth layer comprising an oxide material or a doped oxide material.

In another aspect of the invention, the first layer comprises IZO and/or the second layer comprises silver and/or the fourth layer comprises zinc oxide and/or a fifth layer is present over the fourth layer, with the fifth layer comprising IZO.

The compound TCO electrode can comprise a first layer comprising a doped oxide; a second layer comprising a metallic material; and a third layer comprising IZO, wherein the IZO is deposited in two layers, with a bottom layer deposited at a higher oxygen atmosphere than a top layer.

The compound TCO electrode can comprise a first layer comprising an oxide selected from ITO and IZO; a second layer comprising a metallic material; a third layer comprising ITO; and a fourth layer comprising a material selected from IZO, alumina, silica, or a mixture of alumina and silica.

The compound TCO electrode can comprise a first layer comprising zinc oxide; a second layer comprising a metallic material; and a third layer comprising alumina, silica, or a mixture of alumina and silica.

The compound TCO electrode can comprise a first layer comprising zinc oxide; a second layer comprising a metallic material; and a third layer comprising IZO.

The compound TCO electrode can comprise a first layer comprising an oxide material comprising zinc and tin; a second layer comprising a metallic material; a third layer comprising titanium; and a fourth layer comprising an oxide material comprising zinc and tin.

A compound TCO electrode comprises a first layer comprising a crystalline material and a second layer comprising an amorphous material.

The material of the second layer can comprise one or more dopant materials. The materials for the first and/or second layer can be selected from one or more oxides of Zn, Fe, Mn, Al, Ce, Sn, Sb, Hf, Zr, Ni, Zn, Bi, Ti, Co, Cr, Si, In, or an alloy of two or more of these materials, such as zinc stannate. The material of the second layer can include one or more dopants.

The materials for the first and/or second layers can be selected from fluorine doped tin oxide, zinc doped indium oxide, indium doped tin oxide, tin doped indium oxide, and zinc and tin oxides (such as zinc stannate).

The first layer can comprise a doped metal oxide material and the second layer can comprise vanadium doped indium oxide.

Another compound TCO electrode comprises a first layer comprising a metal layer and a second layer comprising an oxide material.

The metal layer can be selected from platinum, iridium, osmium, palladium, aluminum, gold, copper, silver, or mixtures thereof.

A further compound TCO electrode comprises a first layer comprising an oxide material, a second layer comprising a metallic material, and a third layer comprising an oxide material.

The third layer can comprise an amorphous material.

A still further compound TCO electrode comprises a first layer comprising a doped oxide material and a second layer comprising vanadium doped indium oxide.

Another compound TCO electrode comprises a first layer comprising zinc doped indium oxide, a second layer comprising a metallic material, and a third layer comprising zinc doped indium oxide.

A further compound TCO electrode comprises a first layer comprising a doped oxide, a second layer comprising a metallic material, a third layer comprising titanium, and a fourth layer comprising a doped oxide.

The first layer can be IZO, the metallic layer can be silver, and the fourth layer can be IZO.

A still further compound TCO electrode comprises a first layer comprising a doped oxide, a second layer comprising a metallic material, a third layer comprising indium zinc oxide (IZO), wherein the IZO is deposited in two layers, with the bottom layer deposited at a higher oxygen atmosphere than the top layer.

Another compound TCO electrode comprises a first layer comprising an oxide selected from indium tin oxide (ITO) or IZO, a second layer comprising a metallic material, a third layer comprising ITO, and a fourth layer comprising IZO.

A further compound TCO electrode comprises a first layer comprising an oxide selected from ITO and IZO, a second layer comprising a metallic material, a third layer comprising ITO, and a fourth layer comprising alumina, silica, or a mixture of alumina and silica.

A still further compound TCO electrode comprises a first layer comprising zinc oxide, a second layer comprising a metallic material, and a third layer comprising alumina, silica, or a mixture of alumina and silica.

Another compound TCO electrode comprises a first layer comprising zinc oxide, a second layer comprising a metallic material, and a third layer comprising IZO.

An additional compound TCO electrode comprises a first layer comprising an oxide material comprising zinc and tin, a second layer comprising a metallic material, a third layer comprising titanium, and a fourth layer comprising an oxide material comprising zinc and tin.

A method of increasing the light scattering of a device having a glass substrate comprises: roughening the glass surface; and applying a planarization layer over the roughened surface before forming additional coating layers on the surface.

DESCRIPTION OF THE PREFERRED EMBODIMENTS

Figure 1:
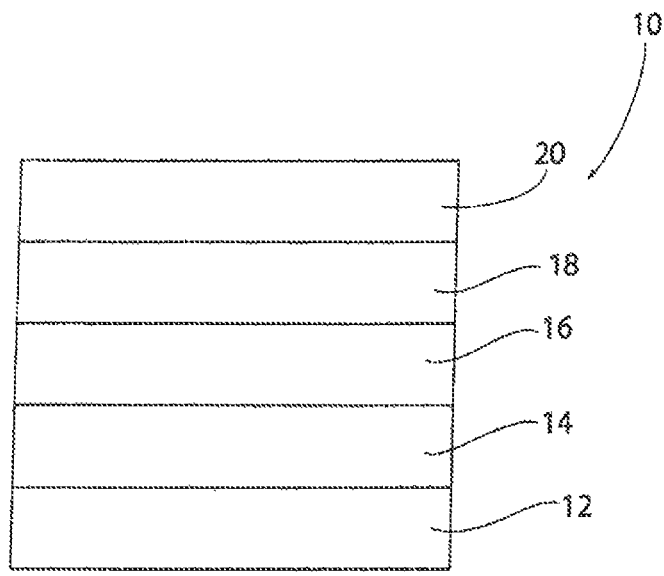
FIG. 1 is a side, sectional view (not to scale) of an OLED device incorporating a compound TCO of the invention.

As used herein, spatial or directional terms, such as "left", "right", "inner", "outer", "above", "below", and the like, relate to the invention as it is shown in the drawing figure. However, it is to be understood that the invention can assume various alternative orientations and, accordingly, such terms are not to be considered as limiting. Further, as used herein, all numbers expressing dimensions, physical characteristics, processing parameters, quantities of ingredients, reaction conditions, and the like, used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 3.3, 4.7 to 7.5, 5.5 to 10, and the like. Additionally, all documents, such as but not limited to, issued patents and patent applications, referred to herein are to be considered to be "incorporated by reference" in their entirety. Any reference to amounts, unless otherwise specified, is "by weight percent". The term "film" refers to a region of a coating having a desired or selected composition. A "layer" comprises one or more "films". A "coating" or "coating stack" is comprised of one or more "layers". The term "compound TCO electrode" means a multilayer or multicomponent electrode having a transparent conductive oxide layer or material plus one or more other layers or materials. The term "free of" means not deliberately added. For example, the phrase "the material is free of X" means that component X is not deliberately added to the material. However, tramp amounts of component X may be present in the material, even though not specifically added. The terms "metal" and "metal oxide" are to be considered to include silicon and silica, respectively, as well as traditionally recognized metals and metal oxides, even though silicon is technically not a metal.

For purposes of the following discussion, the invention will be discussed with reference to a conventional OLED device. However, it is to be understood that the invention is not restricted to use with OLED devices but could be practiced in other fields, such as, but not limited to, photovoltaic thin film solar cells. For other uses, such as thin film solar cells, the glass architecture described later in this application might have to be modified.

The general structure of an OLED device 10 incorporating features of the invention is shown in FIG. 1. The OLED device 10 includes a substrate 12, an optional undercoating 14, a compound TCO electrode 16, an emissive layer 18, and another electrode 20. For purposes of discussion, the compound TCO electrode 16 will be considered the anode and the other electrode 20 will be considered the cathode. The structure and operation of a conventional OLED device will be well understood by one of ordinary skill in the art and, therefore, will not be described in detail.

The substrate 12 can be transparent, translucent, or opaque to visible light. By "transparent" is meant having a visible light transmittance of greater than 0% up to 100%. Alternatively, the substrate 12 can be translucent or opaque. By "translucent" is meant allowing electromagnetic energy (e.g., visible light) to pass through but diffusing this energy such that objects on the side opposite the viewer are not clearly visible. By "opaque" is meant having a visible light transmittance of 0%. Examples of suitable materials include, but are not limited to, plastic substrates (such as acrylic polymers, such as polyacrylates; polyalkylmethacrylates, such as polymethylmethacrylates, polyethylmethacrylates, polypropylmethacrylates, and the like; polyurethanes; polycarbonates; polyalkylterephthalates, such as polyethyleneterephthalate (PET), polypropyleneterephthalates, polybutyleneterephthalates, and the like; polysiloxane-containing polymers; or copolymers of any monomers for preparing these, or any mixtures thereof); or glass substrates. For example, the substrate can include conventional soda-lime-silicate glass, borosilicate glass, or leaded glass. The glass can be clear glass. By "clear glass" is meant non-tinted or non-colored glass. Alternatively, the glass can be tinted or otherwise colored glass. The glass can be annealed or heat-treated glass. As used herein, the term "heat treated" means tempered or at least partially tempered. The glass can be of any type, such as conventional float glass, and can be of any composition having any optical properties, e.g., any value of visible transmission, ultraviolet transmission, infrared transmission, and/or total solar energy transmission. By "float glass" is meant glass formed by a conventional float process in which molten glass is deposited onto a molten metal bath and controllably cooled to form a float glass ribbon. Non-limiting examples of glass that can be used for the practice of the invention include Solargreen®, Solextra®, GL-20®, GL35™, Solarbronze®, Starphire®, Solarphire®, Solarphire PV® and Solargray® glass, all commercially available from PPG Industries Inc. of Pittsburgh, Pa.

The substrate 12 can have a high visible light transmission at a reference wavelength of 550 nanometers (nm) and a thickness of 2 millimeters. By "high visible light transmission" is meant visible light transmission at 550 nm of greater than or equal to 85%, such as greater than or equal to 87%, such as greater than or equal to 90%, such as greater than or equal to 91%, such as greater than or equal to 92%.

The optional undercoating 14 provides the device 10 with various performance advantages, such as acting as a sodium ion barrier between the substrate 12 and the overlying coating layers. The undercoating 14 can be a homogeneous coating. By "homogeneous coating" is meant a coating in which the materials are randomly distributed throughout the coating. Alternatively, the undercoating 14 can comprise a plurality of coating layers or films, (such as, two or more separate coating films). Alternatively still, the undercoating 14 can be a gradient layer. By "gradient layer" is meant a layer having two or more components with the concentration of the components continually changing (or stepped) as the distance from the substrate changes. For example, the optional undercoating 14 can comprise a barrier coating, such as silica, or a mixture of two or more oxides selected from oxides of silicon, titanium, aluminum, zirconium and/or phosphorus.

The emissive layer 18 can be any conventional organic electroluminescent layer as known in the art. Examples of such materials include, but are not limited to, small molecules such as organometallic chelates (e.g., $Alq_3$), fluorescent and phosphorescent dyes, and conjugated dendrimers. Examples of suitable materials include triphenylamine, perylene, rubrene, and quinacridone. Alternatively, electroluminescent polymeric materials are also known. Examples of such conductive polymers include poly(p-phenylene vinylene) and polyfluorene. Phosphorescent materials could also be used. Examples of such materials include polymers such as poly(n-vinylcarbazole) in which an organometallic complex, such as an iridium complex, is added as a dopant.

The cathode 20 can be any conventional OLED cathode. Examples of suitable cathodes include metals, such as but not limited to, barium and calcium. The cathode typically has a low work function. For so called "bottom-emitting" OLED devices, the cathode 20 is typically opaque. However, alternatively, the cathode 20 can be a TCO electrode or any of the compound TCO electrodes described below with respect to the anode.

In the practice of the invention, the compound TCO electrode 16 is a multilayer or multicomponent structure. Examples of compound TCO electrode structures of the invention are shown in FIGS. 2-4 and are described below.

Figure 2:
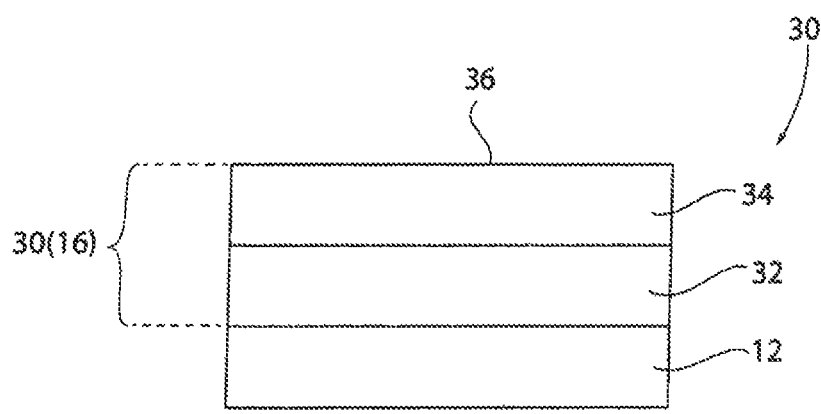
FIGS. 2-11 are various compound TCO electrode structures (not to scale) incorporating features of the invention.

The compound TCO electrode 30 of FIG. 2 has a first layer 32 and a second layer 34. The first layer 32 comprises a crystalline material and the second layer 34 comprises an amorphous material. The crystalline material provides higher electrical conductivity than the amorphous material while the amorphous material provides a smoother upper surface 36 than would be expected with just the crystalline material alone. The smoother upper surface 36 helps reduce the risk of electrical shorts that might be caused by protrusions of the crystalline material that could contact portion the cathode 20. The materials of the first and second layers 32, 34 can be selected from one or more oxide materials, such as but not limited to, one or more oxides of one or more of Zn, Fe, Mn, Al, Ce, Sn, Sb, Hf, Zr, Ni, Zn, Bi, Ti, Co, Cr, Si, In, or an alloy of two or more of these materials, such as zinc stannate. The material can also include one or more dopant materials, such as but not limited to, F, In, Al, P, Zn, and/or Sb. Specific examples of materials for the compound TCO layers include fluorine doped tin oxide, zinc doped indium oxide, indium doped tin oxide, tin doped indium oxide, and zinc and tin oxide (such as zinc stannate or a mixture of zinc oxide and tin oxide). In one preferred embodiment, the first layer 32 includes a dopant material to enhance the electrical conductivity of the first layer and the second layer 34 does not include a dopant material. In this document, if the terms oxide material, metal oxide, dopant, and the like are used but not specifically defined, these terms are to be construed in light of the disclosure and definitions set forth in this paragraph.

Figure 3:
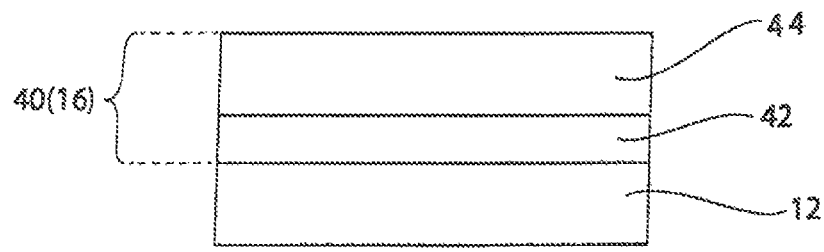

Another compound TCO electrode 40 is shown in FIG. 3. This electrode 40 includes a metal layer 42 and an amorphous transparent conductive oxide layer 44 over the metal layer 42. The metal layer 42 can be selected from, but not limited to, metallic platinum, iridium, osmium, palladium, aluminum, gold, copper, silver, or mixtures, alloys, or combinations thereof. The amorphous conductive oxide layer 44 can be as discussed above. Use of the terms metal, metallic, metal layer, and the like used in this document but not specifically defined are to be construed in light of the disclosure and definitions set forth in this paragraph.

Figure 4:
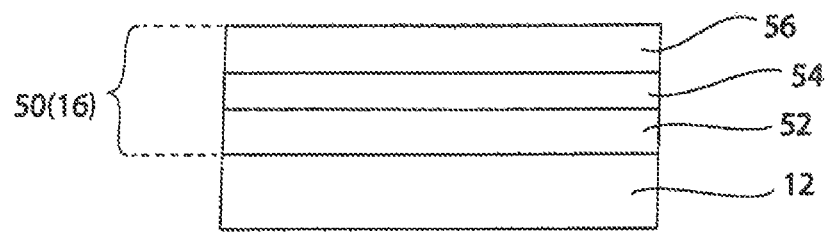

A further compound TCO electrode 50 is shown in FIG. 4. The electrode 50 has a first layer 52, a metallic layer 54, and a second layer 56. The second (outer) layer 56 is an amorphous transparent conductive oxide and the metal layer 54 is as described above. The first (inner) layer 52 can be an amorphous layer or a crystalline layer, as described above.

Figure 5:
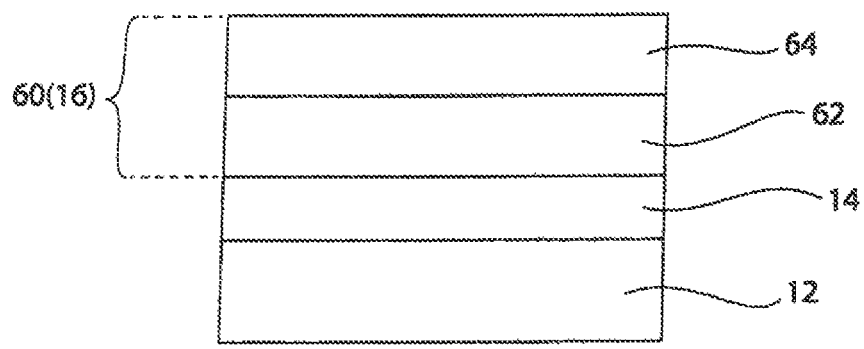

Another useful compound TCO electrode 60 is shown in FIG. 5. In this embodiment, a first layer 62 is formed over an undercoating 14. The first layer 62 comprises a doped metal oxide material, such as any of those described above. However, the second layer 64 comprises vanadium doped indium oxide. It is believed that this structure will result in higher light output with lower turn on voltage. In a preferred embodiment, the first layer 62 is or includes fluorine doped tin oxide or indium doped tin oxide.

Alternative Electrode Structures

Figure 6:
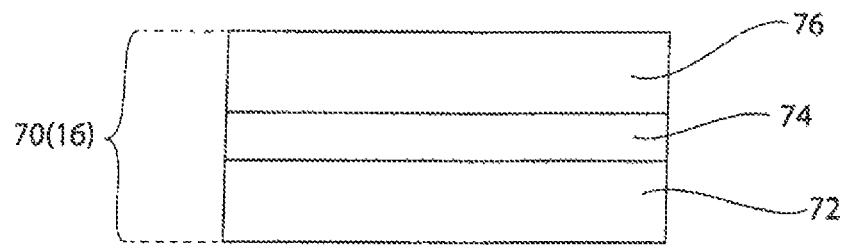

FIG. 6 shows another compound TCO electrode 70. The compound TCO electrode 70 has a first layer 72, a metal layer 74, and a top layer 76. These layers can be deposited by room temperature sputtering without intentional heating. In a preferred embodiment, the first layer 72 and second layer 74 are both zinc doped indium oxide (IZO) and the metallic layer 74 is silver. The metal layer 74 has a thickness in the range of 5 nm to 15 nm, such as 6 nm to 14 nm, such as 8 nm to 12 nm. The bottom layer 72 has a thickness in the range of 3 nm to 50 nm, such as 3 nm to 40 nm, such as 3 nm to 30 nm. Alternatively, the bottom layer 72 can have a thickness greater than 20 nm, such as greater than 30 nm, such as greater than 40 nm. Alternatively still, the bottom layer 72 can be a single layer dielectric material (for example an oxide, nitride, or oxynitride material) having a high refractive index. For example, the refractive index of the bottom layer 72 can be greater than that of the glass substrate 12 but lower than or equal to that of IZO in the visible spectrum. The bottom layer 72 can serve as an antireflection coating and could also be a multilayer stack, such as a high-low-high refractive index band pass filter. In a preferred embodiment, the top layer 76 has a thickness in the range of 5 nm to 15 nm, such as 6 nm to 14 nm, such as 8 nm to 12 nm.

Figure 7:
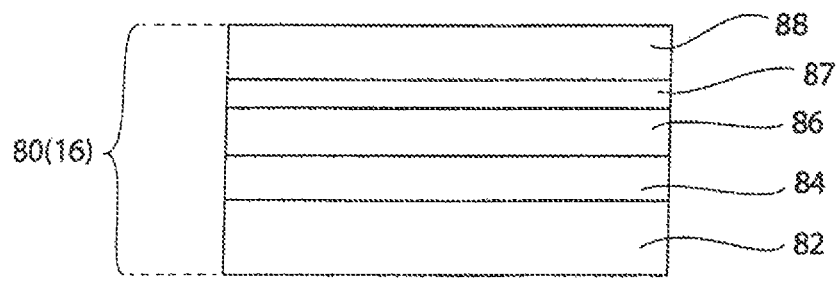

FIG. 7 illustrates another compound TCO electrode 80. This electrode 80 has a first layer 82 comprising a doped metal oxide, a metal layer 84, a primer layer 86, a metal oxide layer 87, and another metal oxide layer 88. In a preferred embodiment, the first layer 82 comprises IZO. In a preferred embodiment, the metal layer 84 comprises silver. In a preferred embodiment, the primer layer 86 comprises titania. In a preferred embodiment, the metal oxide layer comprises zinc oxide and the other metal oxide layer 88 comprises IZO. For example, in a sputtering process, a layer of titanium metal in the range of 1 nm to 2 nm can be deposited over the metal layer 84 in a nonreactive (low oxygen) atmosphere. A layer 87 of zinc oxide of 1 nm to 2 nm can be deposited over the titanium layer 86. The zinc oxide layer 87 can be sputtered from a zinc cathode (for example containing up to 15 weight percent tin, such as up to ten weight percent tin) in an oxygen atmosphere. The tin is present to improve the sputtering characteristics of the cathode. As used herein throughout, the term "zinc oxide" includes not only a pure oxide of zinc but also encompasses zinc oxide with up to 15 weight percent, such as up to 10 weight percent, tin oxide present from the tin in the cathode. Deposition of the zinc oxide layer 87 in an oxygen atmosphere also results in oxidation of the underlying titanium layer 86 to titania. The other oxide layer 88, such as an IZO layer, can be provided over the zinc oxide layer 87.

Alternatively, the metal oxide layer 87 can be eliminated and the other metal oxide layer 88 (for example, IZO) can be deposited in two layers directly over the primer layer 86. The bottom layer of the metal oxide layer 88 could be deposited under high oxygen content to help convert the titanium metal of the primer layer 86 to titania. The top part of the IZO layer 88 could then be deposited using the optimized 20 deposition parameters for a desired IZO coating.

Another way to convert the titanium metal to titanium oxide would be to expose the titanium primer layer 86 to oxygen plasma.

Figure 8:
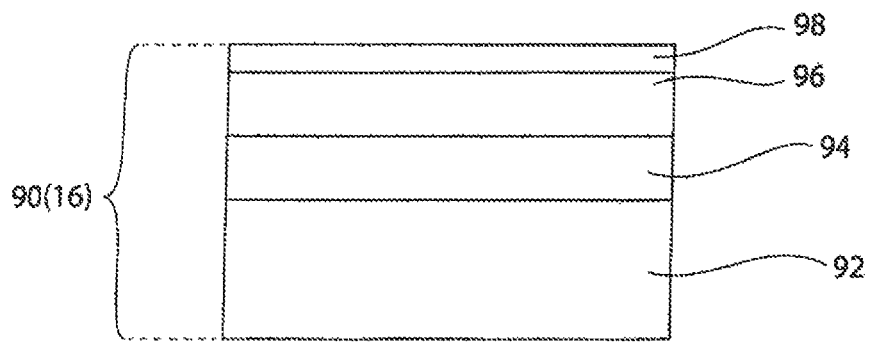

FIG. 8 illustrates another compound TCO electrode 90. This electrode 90 structure includes a first layer 92 comprising a material with a relatively high refractive index. In a preferred embodiment, the material of the first layer 92 can be ITO, IZO, or any other dielectric with a high refractive index. In a more preferred embodiment, the material is ITO. A metallic layer 94 is over the first layer 92. The metallic layer 94 can be any of the metallic layers described above. In a preferred embodiment, the metallic layer 94 comprises silver. A second layer 96 of a metal oxide material is over the metallic layer 94 and a top layer 98 of a metal oxide material is over the second layer 96. In a preferred embodiment, the second layer comprises ITO and the top layer 98 comprises IZO. The top layer 98 has a thickness of less than 1 nm. Since IZO has a higher work function than ITO, the preferred embodiment would result in a lower turn on voltage for the OLED device or increased power efficiency.

Figure 9:
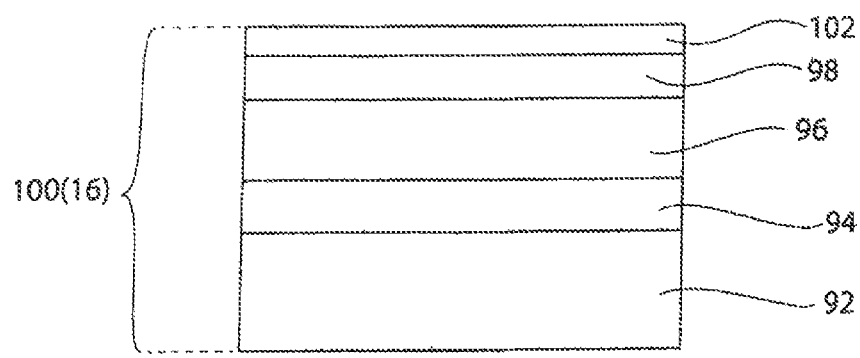

FIG. 9 illustrates another compound TCO electrode structure 100. The layers in this embodiment similar to those described above with respect to FIG. 8 have the same reference numbers as in FIG. 8. However, this structure includes an outer layer 102 of an oxygen barrier material. Example of the oxygen barrier material include silica, alumina, or a mixture of silica and alumina. The top layer 102 has a thickness in the range of 1 nm to 5 nm, such as 1 nm to 4 nm, such as 1 nm to 3 nm. When exposed to high temperatures and oxygen, such as during bending or heat treating of the coated substrate 12, the top layer 98 (for example IZO) can become less reduced, resulting in lower conductivity. The outer layer 102 helps to prevent this by protecting the IZO layer 98 from oxidation.

Figure 10:
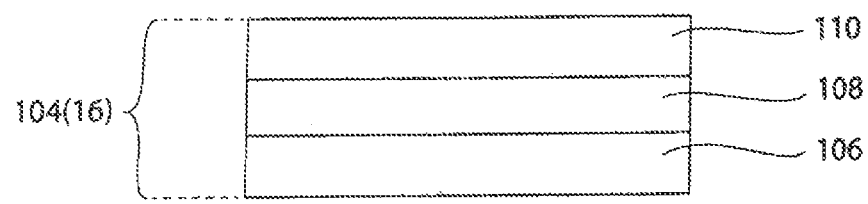

FIG. 10 illustrates a further compound TCO electrode 104 structure of the invention having a first layer 106, a second layer 108, and a third layer 110. The first layer 106 can be a metal oxide layer, the second layer 108 can be a metal layer, and the third layer 110 can be a protective coating. In a preferred embodiment, the first layer 106 comprises zinc oxide (including up to 15 weight percent tin oxide, such as up to 10 weight percent tin oxide). In a preferred embodiment, the second layer 108 comprises metallic silver. In a preferred embodiment, the third layer 110 comprises silica, alumina, or a mixture of silica and alumina. For example, the third layer can comprise a mixture of silica and alumina with the silica in the range of 40 weight percent to 90 weight percent, such as 40 weight percent to 85 weight percent.

Alternatively, the first layer 106 and second layer 108 can be as described above but the third layer 110 can be a metal oxide layer. In a preferred embodiment of this alternative, the metal oxide comprises IZO.

Figure 11:
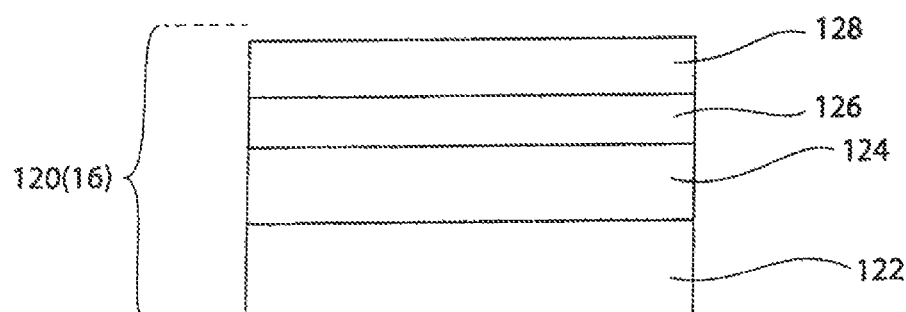

FIG. 11 illustrates another compound TCO electrode 120 having a first layer 122, a second layer 124, a third layer 126, and a fourth layer 128. The first layer 122 can be a metal oxide layer, such as a zinc oxide layer, such as described above for FIG. 10. Or, the first layer 122 can be a zinc-tin alloy layer, such as zinc stannate. The second layer 124 is a metallic layer. In a preferred embodiment, the metal comprises metallic silver. The third layer 126 is a primer layer. In a preferred embodiment, the primer material comprises titanium. The fourth layer 128 is a metal oxide layer. In a preferred embodiment, the fourth layer 128 comprises zinc oxide.

Increased Light Scattering

Figure 12:
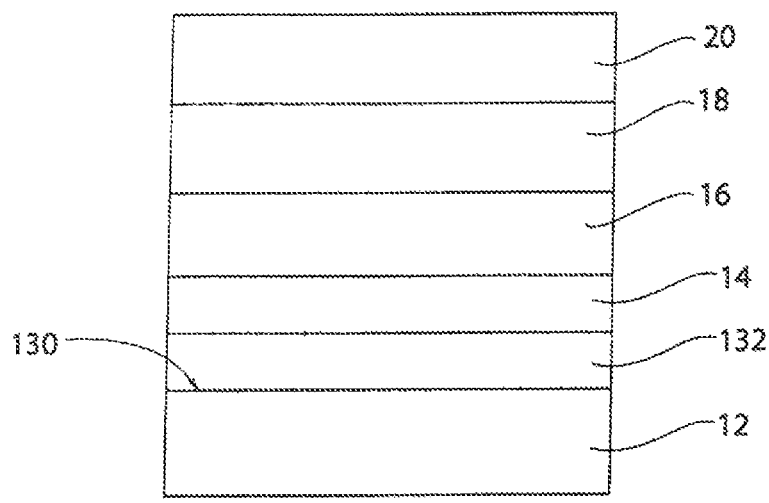
FIG. 12 illustrates the use of a planarization layer (not to scale) in accordance with the invention.

In conventional bottom emitting OLEDs, over eighty percent of the light produced is lost due to wave guiding. In order to improve light emission, internal and external light extraction layers have been developed. However, these light extraction layers complicate the manufacturing process and impact upon anode surface smoothness. In one aspect of the invention illustrated in FIG. 12, rather than a light extraction layer, the surface 130 of the glass substrate 12 onto which the layers of the OLED device will be provided is roughened to help promote light scattering and then a planarization layer 132 is applied to present a smoother surface for the further coatings. The glass surface can be roughened by any conventional method, such as mechanical abrasion or chemical etching. The planarization layer 132 can then be applied by conventional methods, such as CVD, sol-gel, spin coating, spray pyrolysis, MSVD, etc. The planarization layer 132 preferably has a refractive index similar to that of the overlying electrode. One example of a planarization layer 132 would be amorphous IZO having a thickness in the range of 100 nm to 500 nm, such as 200 nm to 400 nm, such as 300 nm.

It will be readily appreciated by one of ordinary skill in the art that modifications may be made to the invention without departing from the concepts disclosed in the foregoing description. Accordingly, the particular embodiments described in detail herein are illustrative only and are not limiting to the scope of the invention, which is to be given the full breadth of the appended claims and any and all equivalents thereof.

What is claimed is:

1. An organic light emitting diode device, comprising:
   a substrate, wherein the substrate is roughened;
   a planarization layer comprising amorphous indium-zinc oxide (IZO);
   an emissive layer;
   a first electrode; and
   a second electrode,
   wherein at least one of the first and second electrodes comprises a compound transparent conductive oxide (TCO) electrode comprising:
   a first layer comprising an oxide material;
   a second layer comprising a metal material;
   a third layer comprising an oxide material;
   a fourth layer comprising zinc oxide; and
   a fifth layer over the fourth layer, the fifth layer comprising IZO.

2. The device of claim 1, wherein the oxide materials of the first and third layers are independently selected from one or more oxides of Zn, Fe, Mn, Al, Ce, Sn, Sb, Hf, Zr, Ni, Bi, Ti, Co, Cr, Si, In, or an alloy of two or more of these materials.

3. The device of claim 1, wherein the material of at least one of the first layer or the third layer comprises one or more dopant materials.

4. The device of claim 1, wherein the metal material of the second layer is selected from the group consisting of platinum, iridium, osmium, palladium, aluminum, gold, copper, silver, or mixtures thereof.

5. The device of claim 1, wherein the first layer comprises zinc doped indium oxide and the third layer comprises zinc doped indium oxide.

6. The device of claim 1, wherein the first layer comprises a doped oxide, and the third layer comprises titanium.

7. The device of claim 1, wherein the first layer comprises IZO.

8. The device of claim 1, wherein the second layer comprises silver.

9. The device of claim 1, wherein the compound TCO electrode comprises:
   the first layer comprising a doped oxide;
   the second layer comprising a metallic material; and
   the third layer comprising IZO, wherein the IZO is deposited in two layers, with a bottom layer deposited at a higher oxygen atmosphere than a top layer.

10. The device of claim 1, wherein the compound TCO electrode comprises:
    the first layer comprising an oxide selected from ITO and IZO;
    the second layer comprising a metallic material; and
    the third layer comprising ITO.

11. The device of claim 1, wherein the compound TCO electrode comprises:
    the first layer comprising zinc oxide;
    the second layer comprising a metallic material; and
    the third layer comprising alumina, silica, or a mixture of alumina and silica.

12. The device of claim 1, wherein the compound TCO electrode comprises:
    the first layer comprising zinc oxide;
    the second layer comprising a metallic material; and
    the third layer comprising IZO.

13. The device of claim 1, wherein the compound TCO electrode comprises:
    the first layer comprising an oxide material comprising zinc and tin;
    the second layer comprising a metallic material; and
    the third layer comprising titanium.

14. The organic light emitting diode device according to claim 1, wherein the planarization layer has a thickness in the range of 100 nm to 500 nm.

* * * * *